United States Patent [19]

Sun

[11] 4,125,884
[45] Nov. 14, 1978

[54] APPARATUS FOR DETECTING SUBSYNCHRONOUS CURRENT IN POWER SYSTEMS

[75] Inventor: Shan C. Sun, Bell Township, Westmoreland County, Pa.

[73] Assignee: Westinghouse Electric Corp., Pittsburgh, Pa.

[21] Appl. No.: 757,177

[22] Filed: Jan. 6, 1977

[51] Int. Cl.² ............................................. H02H 3/26
[52] U.S. Cl. ...................................... 361/79; 322/32; 322/58; 328/134; 340/658; 361/111; 361/113; 307/129
[58] Field of Search ...................... 361/30, 79, 113, 78, 361/82, 84, 93, 110, 111, 184, 182, 183; 324/142, 141, 77 E, 77 R, 107, 108, 78 F; 322/24, 25, 32, 58; 328/133, 134; 340/253 Y; 307/86, 129, 152, 153

[56] References Cited

U.S. PATENT DOCUMENTS

| | | | |
|---|---|---|---|
| 3,654,516 | 4/1972 | Traversi | 361/93 X |
| 3,886,449 | 5/1975 | Wolfinger | 324/142 |
| 3,999,115 | 12/1976 | South et al. | 322/58 X |

*Primary Examiner*—Patrick R. Salce
*Attorney, Agent, or Firm*—D. R. Lackey

[57] ABSTRACT

Apparatus for detecting the presence of subsynchronous current components in an electrical generating or transmission system is disclosed. Input signals, representative respectively of line voltage and current, are conditioned and initially filtered to suppress high frequency noise. The input voltage signal is further limited and filtered to produce a constant amplitude, sinusoid reference. The input signals are then multiplied to yield the subsynchronous current signal components, if any, which undergo further filtration by a bandpass filter circuit. In addition, the detection apparatus is provided with circuit means for insuring protection against overvoltage and current surge conditions.

5 Claims, 2 Drawing Figures

APPARATUS FOR DETECTING SUBSYNCHRONOUS CURRENT IN POWER SYSTEMS

CROSS-REFERENCE TO RELATED APPLICATIONS

Reference is hereby made to copending and related U.S. Pat. Application No. 757,178 filed on Jan. 6, 1977 in the names of S. C. Sun and L. L. Church, entitled "Apparatus For Protection Against Subsynchronous Currents In A Power System", which application is commonly assigned. The disclosure therein is hereby incorporated by reference.

BACKGROUND OF THE INVENTION

The present invention relates to power transmission systems and, more particularly, to apparatus for detecting and monitoring subsynchronous current in such power transmission systems.

The existence of asynchronous oscillations, i.e. oscillations at frequencies other than the generator's normal frequency, in power systems and series-compensated transmission lines has been known for years. Asynchronous oscillations occur as a result of the interaction or resonance of the system's capacitive and inductive components in response to transient conditions such as switching surges, fault initiation, and clearing. Usually, the oscillations are quickly damped by the resistive losses of the system and the natural or resonant frequencies do not precipitate other resonance reaction elsewhere in the system.

However, as the series capacitor compensation technique is increasingly employed for optimizing transmission capability of long high-voltage and extra-high-voltage lines, the expectancy that the natural frequencies of the asynchronous oscillations could and would fall below the 60 hertz (Hz.) synchronous frequency of the system becomes greatly increased. When this happens, mechanical resonance response in the generating equipment, via the stator windings, might be triggered.

Once an electrically initiated mechanical oscillation takes place, sustained or growing subsynchronous oscillations can be expected in a fashion similar to that of a positive feedback system. This effect could lead to eventual malfunction or even destruction of the generating equipment. Recently, there have been reported existences of generator damage and failure caused by subsynchronous oscillations. Thus, detection, monitoring and control of subsynchronous oscillations have become critical problems in the utility industry.

SUMMARY OF THE INVENTION

Accordingly, there is provided apparatus for detecting the presence of subsynchronous current components in a power generating or transmission system. The apparatus includes circuit means for developing signals representative of line voltage and current. These input signals are conditioned by appropriate circuit means to suppress high frequency noise.

The input voltage signal is further conditioned to develop a reference sinusoid of constant amplitude. The reference sinusoid is then multiplied in an analog multiplying circuit by the input current signal to yield a signal representative of subsynchronous current components, if any.

Overvoltage and surge current protection are also provided to protect the detection apparatus. In addition, the reference sinusoid developing circuit is a.c. coupled to the multiplying circuit thereby eliminating the need for trimming in the further conditioning circuitry wherein the reference sinusoid is developed.

DESCRIPTION OF THE PREFERRED EMBODIMENT

Figure 1:
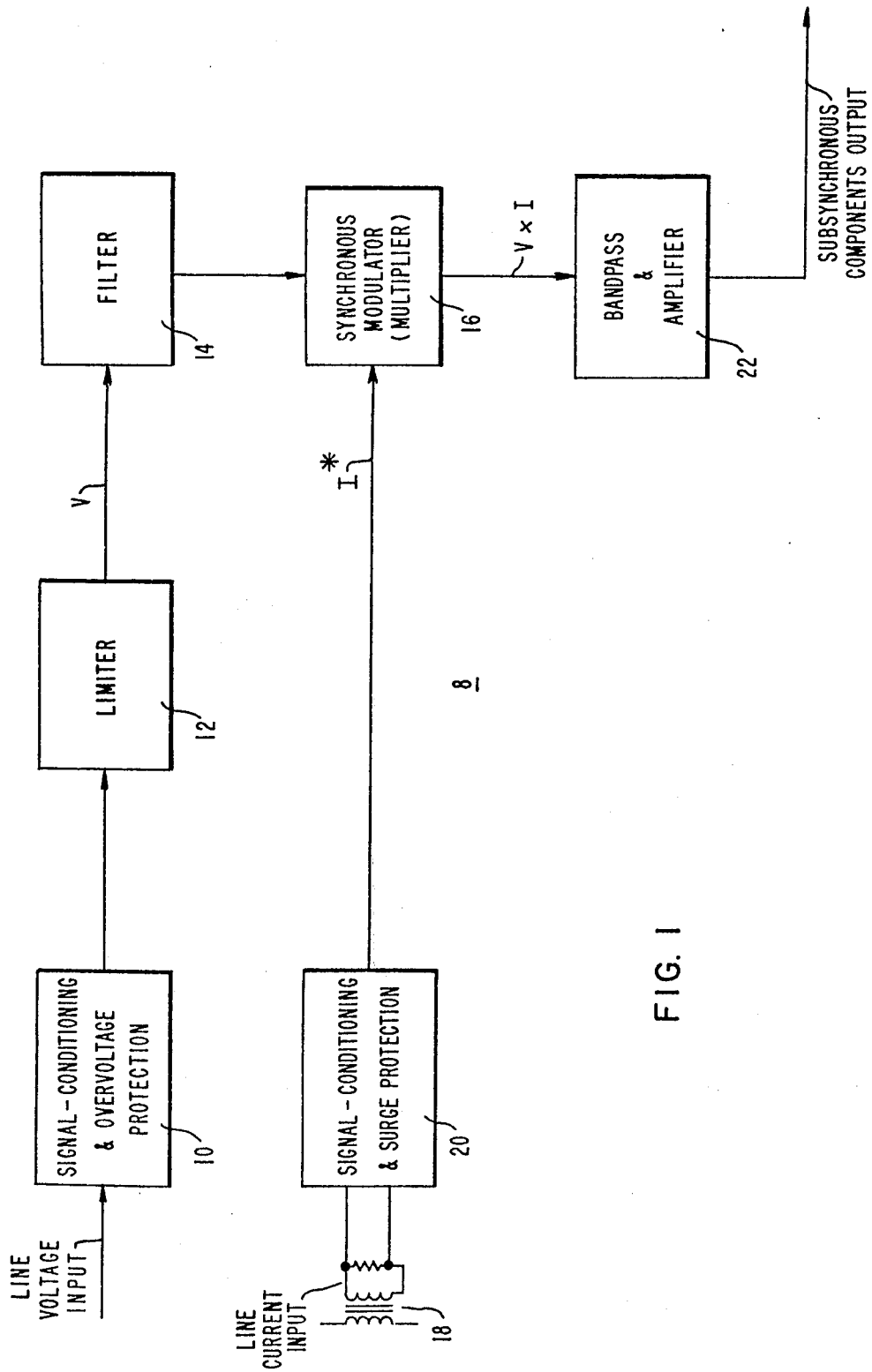
FIG. 1 illustrates a block diagram of the invention wherein subsynchronous components are identified and isolated.

A functional block diagram of the apparatus employed to achieve single phase subsynchronous current monitoring is shown in FIG. 1. It will be understood and appreciated by those skilled in the art, that the apparatus shown and the method implicit therein for monitoring subsynchronous current are applicable to three phase systems also.

The line voltage, which usually carries very little asynchronous components, is used as a reference input to the synchronous monitoring circuit 8. The line voltage is brought down to a workable level, compatible with the components used to implement the functions of the synchronous monitoring circuit 8, by either a step-down transformer or a suitable voltage divider (not shown). The signal conditioning and protection circuit 10 removes high frequency noise and provides proper overvoltage protection for the synchronous monitoring circuit 8.

The limiter circuit 12 transforms the sinusoidal line voltage into a square-wave voltage of the same frequency, but having a well defined amplitude. This is achieved by high gain amplification and precision amplitude limiting means. The filter circuit 14 which follows the limiter circuit 12 receives its input V therefrom and removes the harmonic contents of the square wave to produce a constant amplitude, 60 hertz, sinusoidal voltage which is insensitive to line voltage fluctuations.

The line current signal, in which the subsynchronous components are contained, is acquired via a current transformer shunt circuit 18 or by other equivalent means. Once acquired, the line current signal is fed to the signal conditioning and surge protection circuit 20. The signal conditioning and surge protection circuit 20 is similar to the signal conditioning and overvoltage protection circuit 10 in that it also suppresses high frequency noise. It also provides current surge protection for the synchronous monitoring circuit 8.

The conditioned, filtered output voltage V of the filter circuit 14 and the conditioned, current signal I* (expressed in voltage form) of the signal conditioning and surge protection circuit 20 are fed to the synchronous modulator circuit 16. This circuit accepts the conditioned voltage and current signals and performs a multiplication function therewith, the results of which are best explained mathematically below. Assume that the line voltage and current after conditioning are mathematically represented as follows:

$$V = V_p \sin \omega_o t, \text{ and} \tag{1}$$

$$I = I_p \sin (\omega_o t + \theta) + I_s \sin \omega_s t; \tag{2}$$

where $V_p$ and $I_p$ are the peak values of the line voltage and current at normal line frequency ($\omega_o$), and $\omega_o$ = normal 60 hertz line frequency expressed in rad./sec., $\omega_s$ = subsynchronous frequency expressed in rad./sec., $I_s$ = peak value of subsynchronous current, and $\theta$ = phase angle between line voltage and current at normal line frequency.

Thus, the signal obtained at the output of the synchronous modulator circuit 16 is:

$$V \times I = (V_p I_p/2)[\cos\theta - \cos(2\omega_o t + \theta)] + (V_p I_s/2)[\cos(\omega_o - \omega_s) - \cos(\omega_o + \omega_s)t]. \quad (3)$$

It will be evident from inspection of equation (3) that the function of the synchronous modulator circuit 16, in performing its multiplication, is to eliminate the $\omega_o$ frequency. Thus, in performing a multiplication of the conditioned line voltage and current signals, it produces the doubled frequency term $2\omega_o$ and the two beat frequency terms $(\omega_o - \omega_s)$ and $(\omega_o + \omega_s)$. As a result, the frequency separation between the doubled frequency term $2\omega_o$ and the beat frequency term $(\omega_o + \omega_s)$ is much greater than the frequency difference between $\omega_o$ and $\omega_s$. Consequently, the filter design for separating $(\omega_o - \omega_s)$ from $2\omega_o$ is less difficult to implement than the design needed for separating $\omega_s$ from $\omega_o$.

Attenuation for the beat frequency term $(\omega_o + \omega_s)$ is carried out automatically by the bandpass filter circuit 22 which also serves to attenuate the $2\omega_o$ term since the $(\omega_o + \omega_s)$ frequency is in between $2\omega_o$ and $(\omega_o - \omega_s)$ and the amplitude of the $(\omega_o + \omega_s)$ term is exactly the same as that of the $(\omega_o - \omega_s)$ term. In practice, the phase angle $\theta$ is either a fixed term or a term which varies very slowly.

Although the beat frequency term $(\omega_o - \omega_s)$ does not suggest the value of the $\omega_s$ frequency directly, a little interpretation will identify the exact $\omega_s$, since $\omega_o$ is clearly defined. Furthermore, since the term $V_p$ is a constant, the term $(V_p I_s)$ follows the amplitude behavior of the subsynchronous component precisely. Thus, a bandpass filter circuit 22 of readily implementable design will yield or provide at its output, the detected subsynchronous components.

It will be appreciated that, as an alternative approach, the $I_p \sin(\omega_o t + \theta)$ term in equation (2) can be removed from consideration by subsynchronous detection apparatus through the simple expedient of an appropriately designed filter. However, such an approach has serious drawbacks. Most important of these is the delay inherent in the use of such a filter, which delay might prevent responsive corrective action to the extracted subsynchronous current signal. In addition, the use of such a filter would add unnecessarily to the cost and complexity of the final design.

Figure 2:
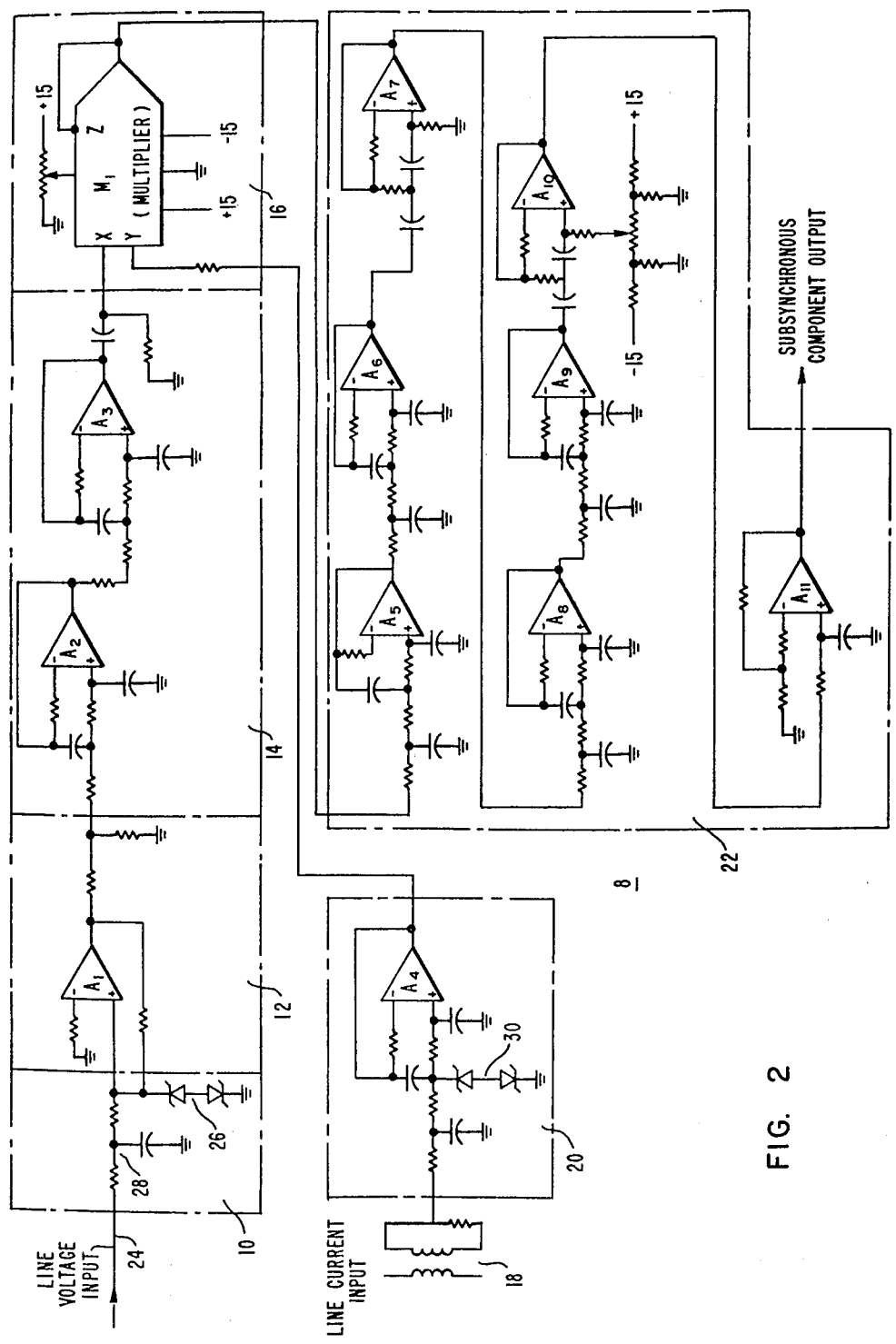
FIG. 2 depicts a circuit diagram wherein the block diagram of FIG. 1 is practically implemented.

A practical design embodying the functional block diagram of FIG. 1 is illustrated in FIG. 2. The 60 hertz line voltage signal is brought into the limiter circuit 12 wherein operational amplifier $A_1$ is suitably connected to yield a square-wave voltage having a 60 hertz fundamental frequency. The signal conditioning and overvoltage protection circuit 10 is interposed between the voltage input connection 24 and the limiting circuit 12. It contains a Zener diode overvoltage circuit 26 and a filter network 28 for protection against line overvoltages and for removing high frequency noise.

The square-wave output of the limiter circuit 12 is then lowpass filtered by a fifth order lowpass filter circuit 14 of active design, which includes the amplifiers $A_2$ and $A_3$, to yield a constant amplitude 60 hertz reference sinusoid for synchronous modulation use. The −3db frequency of the lowpass filter circuit 14 is about 60 hertz. The reference sinusoid is properly scaled and a.c. coupled to the synchronous modulator circuit 16. The a.c. coupling eliminates the need for offset voltage trimming in the limiter and filter circuits 12 and 14.

The current input signal is acquired via the current transformer shunt circuit 18 and fed therefrom to the signal conditioning and surge protection circuit 20. Circuit 20 includes a Zener diode circuit 30 for current surge protection and a third order lowpass filter, including amplifier $A_4$, for suppressing high frequency noise and unwanted current components. The current signal is derived from the current transformer shunt circuit 18 which has been adapted to provide 1.5 volts peak voltage, typically in the preferred embodiment, for each per unit (p.u.) of line current.

The conditioned input signals, V and I*, are then fed to the synchronous modulator circuit 16 where they are multiplied as described above. The multiplication function is performed by a precision analog multiplier $M_1$, which may be one of the M310 series manufactured by Intronix Corporation. The multiplier $M_1$ uses the pulse width/pulse height modulation principle which offers good accuracy and low drift. Since the multiplier $M_1$ has an internal 10 to 1 scaling factor, with a 10 volt peak reference sinusoid, the processed subsynchronous current or SSC is in a form of $[(VI_s/2) \cos(\omega_o - \omega_s)t]$, where $VI_s$ is the peak value of the SSC in voltage form as seen at the input of multiplier $M_1$.

The bandpass filter circuit 22 is of a modified Butterworth type having a thirteenth order lowpass section and a fourth order highpass section. It includes amplifiers $A_5$, $A_6$, $A_7$, $A_8$, $A_9$, $A_{10}$ and $A_{11}$ appropriately connected to yield the subsynchronous components. Filter circuit 22 is characterized by a flat passband response from 15 to 45 hertz with 80db attenuation at 1 hertz and 78db attenuation at 120 hertz. The response time for a step input is about 26 m.s. The output stage of filter circuit 22, amplifier $A_{11}$ and its supporting elements, has a built-in voltage gain of four which brings up the detected subsynchronous current signal $(\omega_o - \omega_s)$ level to 3 volts peak. This corresponds to 1 p.u. of line current. The lowpass section of filter circuit 22 serves to remove the $2\omega_o$ and $(\omega_o + \omega_s)$ terms from the output resultant of the synchronous modulator circuit 16 and the highpass section serves to remove the term $\theta$. Thus, only the $(\omega_o - \omega_s)$, properly scaled is outputted by filter circuit 22. It should be noted that amplifiers $A_1$ through $A_{11}$ each respectively comprise one-half of an μA747 dual operational amplifier, or an equivalent, which can be purchased under that designation from any one of a number of manufacturers.

While the invention has been described and shown herein in considerable detail, such disclosure is to be considered as only illustrative or exemplary in character and not restrictive, as within the broad scope of the invention modifications or alternatives may readily suggest themselves to persons skilled in this art.

What is claimed and is desired to be secured by United States Letters Patent is as follows:

1. Apparatus for providing a signal responsive to subsynchronous current flowing in an electrical power system having a voltage generated at a synchronous power generating frequency, comprising:

first means providing a first signal of constant amplitude having a frequency responsive to the synchronous frequency, second means providing a second signal responsive to the current flowing in the power system, which may have a subsynchronous component in addition to the normal synchronous component, third means processing said first and second signals to provide a third signal having first, second and third components whose frequencies are equal to (a) twice the synchronous frequency, (b) the sum of the synchronous and subsynchronous frequencies, and (c) the difference between the synchronous and subsynchronous frequencies, respectively, and fourth means processing said third signal to remove the first and second components thereof and provide a fourth signal responsive to the third component.

2. The apparatus of claim 1 wherein the first signal is a sinusoidal signal of constant amplitude, and wherein the first means provides the first signal by including limiting means responsive to a line voltage of the electrical power system to provide a square wave signal of constant amplitude, and harmonic suppression filter means which processes the square wave signal to provide a sinusoid of constant amplitude.

3. The apparatus of claim 2 including means for A.C. coupling the first signal to the third means to remove any unidirectional component therefrom.

4. The apparatus of claim 1 wherein the fourth means include low pass filter means selected to pass the relatively low frequency third component of the third signal, while substantially blocking the higher frequency first and second components thereof.

5. The apparatus of claim 1 wherein the first means derives the first signal from a line voltage of the power system, and the fourth means includes high pass filter means selected to block unidirectional components of the third signal, and thus remove any component responsive to the phase angle between line voltage and the current flowing in the electrical power system.

* * * * *